US009256375B2

(12) United States Patent
Papandreou et al.

(10) Patent No.: US 9,256,375 B2
(45) Date of Patent: *Feb. 9, 2016

(54) LEVEL PLACEMENT IN SOLID-STATE MEMORY

(71) Applicant: INTERNATIONAL BUSINESS MACHINES CORPORATION, Armonk, NY (US)

(72) Inventors: Nikolaos Papandreou, Thalwil (CH); Charalampos Pozidis, Thalwil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/699,596

(22) Filed: Apr. 29, 2015

(65) Prior Publication Data

US 2015/0234613 A1 Aug. 20, 2015

Related U.S. Application Data

(63) Continuation of application No. 13/752,809, filed on Jan. 29, 2013, now Pat. No. 9,047,179.

(30) Foreign Application Priority Data

Aug. 29, 2012 (GB) .................................. 1215339.1

(51) Int. Cl.
*G11C 29/00* (2006.01)
*G06F 3/06* (2006.01)
(52) U.S. Cl.
CPC ............ *G06F 3/0619* (2013.01); *G06F 3/0631* (2013.01); *G06F 3/0644* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 7,986,549 B1 * | 7/2011 | Tang et al. ..................... | 365/163 |
| 8,009,455 B2 | 8/2011 | Lowrey et al. | |
| 8,441,847 B2 * | 5/2013 | Eleftheriou et al. .......... | 365/163 |
| 8,446,759 B2 * | 5/2013 | Eleftheriou et al. .......... | 365/163 |
| 8,755,214 B2 * | 6/2014 | Frey et al. ..................... | 365/148 |
| 2009/0319868 A1 * | 12/2009 | Sharon et al. ................. | 714/763 |
| 2010/0182825 A1 * | 7/2010 | Lowrey et al. ................ | 365/163 |

(Continued)

OTHER PUBLICATIONS

Peleato, B., et al. "Maximizing MLC NAND Lifetime and Reliability in the Presence of Write Noise" Proceedings of IEEE International Conference on Communications. Jun. 2012. pp. 3752-3756.

Pozidis, H., et al. "A Framework for Reliability Assessment in Multilevel Phase-Change Memory" 4th IEEE International Memory Workshop (IMVV). May 2012. (4 Pages).

(Continued)

*Primary Examiner* — Daniel McMahon
(74) *Attorney, Agent, or Firm* — Tutunjian & Bitetto, P.C.; Jennifer R. Davis

(57) ABSTRACT

Methods and apparatus are provided for determining level placement in q-level cells of solid-state memory, where q>2. A group cells is read, where each cell is programmed to a respective programming level, at a series of time instants to obtain a sequence of read metric values for that cell. Statistical data as a function of time for each level is derived by processing the sequence of read metric values for the group of cells. At least one parameter of a model defining variation with time of the statistical data is determined. Calculating a set of q programming levels which has a pre-determined property over time based on a variation of the parameter as a function of level and the model.

17 Claims, 5 Drawing Sheets

(56) References Cited

U.S. PATENT DOCUMENTS

| | | | |
|---|---|---|---|
| 2010/0192042 A1* | 7/2010 | Sharon et al. | 714/763 |
| 2010/0218071 A1* | 8/2010 | Lastras-Montano et al. | 714/763 |
| 2012/0063195 A1* | 3/2012 | Lam et al. | 365/148 |
| 2012/0144272 A1* | 6/2012 | Franceschini et al. | 714/773 |

OTHER PUBLICATIONS

Whalen, A. "Detection of Signals in Noise" Electrical Science Series. Academic Press Inc. 1971. pp. 179-186.

* cited by examiner

LEVEL PLACEMENT IN SOLID-STATE MEMORY

RELATED APPLICATION INFORMATION

This application is a Continuation application of co-pending U.S. patent application Ser. No. 13/752,809, filed on Jan. 29, 2013, which is incorporated herein by reference in its entirety.

TECHNICAL FIELD

This invention generally relates to level placement in multilevel cells of solid-state memory.

BACKGROUND OF THE INVENTION

In solid-state memory such as flash memory and phase change memory (PCM), the fundamental storage unit (the "cell") can be programmed to a number of different states, or "levels", which exhibit different electrical characteristics. The q programming levels can be used to represent different data values, whereby data can be recorded in the cells. In multilevel-cell (MLC) memories, the cells have q>2 levels, providing for storage of more than one bit per cell.

Each of the q programming levels in MLC memory corresponds to a respective value of a characteristic metric which is used as a measure of cell-state. This metric is typically some function of cell current, voltage, or resistance. A cell is programmed to a particular level using the corresponding metric value as the target metric value for the programming operation. A programming (current or voltage) signal is applied to the cell so as to induce a cell-state corresponding to the target metric value. This is typically achieved via an iterative "write-and verify" (WAV) process involving a series of programming pulses, with the cell being read after each pulse and the resulting read metric value compared with the target metric value for the required level. Successive programming pulses are then adjusted based on this comparison so as to converge on the target metric value for the level.

In an ideal scenario, all cells programmed to a particular level should yield the target metric value on readback. Due to variability and noise, however, the read metric values from a group of cells programmed to the same level form a distribution around the target metric value for that level. In addition, read metric values for levels are known to drift over time. The electrical resistance of PCM cells, for instance, drifts upwards with time in a stochastic manner. As another example, in flash memory cells the transistor's threshold voltage provides the cell-state metric and this drifts upwards as a function of the number of write/erase cycles the cell is subjected to. Drift can be variable for different cells and for different levels. In PCM cells, for example, levels drift in a non-uniform fashion, cells programmed to the same level exhibit different drift characteristics, and variability due to drift affects different levels in different ways. In addition to drift, the cell readout process is prone to noise, the variance and spectral density of which are different for different levels. All these characteristics lead to the fact that the probability density functions (PDFs) for cell-levels are not only level-dependent but are also time-varying, as in PCM, and/or varying with cell-usage, as in flash memory.

A problem arising from drift effects is that the read metric values for cells programmed to neighbouring programming levels may interfere over time, causing difficulties in detecting the different cell-levels on readback. This leads to an increased probability of read-errors. MLC memory needs to offer acceptable error-rate performance, and to guarantee this acceptable performance over a minimum specified time period (the "retention time" of the memory). The placement of programming levels within the available signal range, i.e. the particular selection of target metric values for programming the q levels, plays a defining role in the achievement of these objectives.

Conventionally, the level placement problem has been solved by an optimization technique which receives as input the statistical distributions of the q possible levels. An initial set of q levels is typically defined by assuming uniform level-spacing across the available signal range. The statistics of these levels are determined from the measured read metric values on programming groups of cells to the different levels. The means and variances of the level distributions are then input to an iterative optimization process to determine an optimal level placement. Such iterative optimization algorithms are well-known and can be constructed by established techniques discussed, for example, in "Detection of Signals in Noise", A. D. Whalen, Academic Press, 1971. The optimal level placement is determined as that which minimizes the read-error probability as calculated from the level statistics on programming of the initial level set. However, an optimal solution here would actually require knowledge of the probability density functions for all possible target levels within the signal range. Moreover, the drift effects discussed above are not considered.

U.S. Pat. No. 8,009,455 B2 discloses a procedure for assigning resistance value ranges to storage levels in phase-change memory. Each resistance range includes a first sub-range determined by the probability distribution of the level at the time of programming, and a second sub-range determined by the drift coefficient of the particular level. The second sub-range acts as a buffer region between a particular level and the neighbouring level. Ranges can be assigned based on various deterministic criteria, e.g. so that the drift buffer associated with the worst-case drift coefficient accommodates a target retention time for the memory.

SUMMARY OF THE INVENTION

One embodiment of a first aspect of the present invention provides a level placement method for q-level cells of solid-state memory, where q>2. The method comprises:

controlling programming of groups of the cells to respective levels of a predetermined plurality of programming levels;

controlling reading of each programmed cell at a series of time instants to obtain a sequence of read metric values for that cell;

processing the sequences of read metric values for the group of cells programmed to each programming level to derive statistical data as a function of time for that level;

processing said statistical data for each programming level to determine for that level at least one parameter of a model defining variation with time of the statistical data for programming levels;

extrapolating the parameters for the levels to define parameter variation as a function of level; and calculating from said parameter variation and said model a set of q programming levels which has a desired property over time.

In methods embodying this invention, therefore, sequences of read metric values obtained at a series of time instants after programming cells to L different levels are used to derive statistical data as a function of time for each of the L levels. This time-dependent statistical data is processed to determined parameters for the L levels of a model defining variation of statistical data with time. By extrapolation of these parameters, the parameter variation with level can be determined. The resulting parameter variation can then be used with the model to provide an estimate of the time-dependent statistical data for any programming level. In effect, therefore, statistical data can be estimated for any arbitrary programming level at any time after programming. This can be used to calculate a level placement for q cell-levels which has some desired property with passage of time. The method can be used, for example, to identify a set of q levels which has some desired statistical data, as predicted by the model, at a predetermined time after programming. In particular, the calculated levels may have statistical data associated with a desired read-error probability $P_{error}$, e.g. a $P_{error}$ less than some required threshold, at a specified time after programming. For example, the level placement corresponding to a minimum error probability at a specified time, e.g. the required retention time of the memory, can be readily determined.

Embodiments of the invention may thus offer level placement techniques which address time variability of cell-levels, permitting estimation of level statistics for arbitrary levels and storage times. By addressing both the level- and time-dependence of level statistics, the various effects of drift and noise discussed above can be accommodated, and the key objective of acceptable error performance over a target retention time can be readily achieved. Compared to the prior techniques discussed above, embodiments of the invention can achieve superior worst-case performance over longer time-scales in MLC memory.

An embodiment of a second aspect of the invention provides a computer readable medium containing executable program instructions for causing a computer to implement a method according to the first aspect of the invention. It will be understood that the term "computer" is used in the most general sense and includes any device, component or system having a data processing capability for implementing a computer program. Moreover, a computer program embodying the invention may constitute an independent program or may be an element of a larger program, and may be embodied in a computer-readable medium for loading in a computer. The executable program instructions of the computer program may comprise any expression, in any language, code or notation, of a set of instructions intended to cause a computer to perform the method in question, either directly or after either or both of (a) conversion to another language, code or notation, and (b) reproduction in a different material form.

An embodiment of a third aspect of the invention provides an apparatus for determining level placement in q-level cells of solid-state memory, where q>2. The apparatus comprises:

a measurement controller for controlling programming of groups of the cells to respective levels of a predetermined plurality of programming levels, and controlling reading of each programmed cell at a series of time instants to obtain a sequence of read metric values for that cell;

a measurement processor for processing the sequences of read metric values for the group of cells programmed to each programming level to derive statistical data as a function of time for that level, and then processing said statistical data for each programming level to determine for that level at least one parameter of a model defining variation with time of the statistical data for programming levels, and for extrapolating the parameters for the levels to define parameter variation as a function of level; and a level calculator for calculating from said parameter variation and said model a set of q programming levels which has a desired property over time.

An embodiment of a fourth aspect of the invention provides memory apparatus comprising solid-state memory having a plurality of q-level cells, where q>2, read/write circuitry for writing data in the memory by programming cells to respective levels and for reading cells to obtain respective read metric values each corresponding to a said level, and level placement apparatus for determining level placement for the q levels. The level placement apparatus comprises apparatus according to the third aspect of the invention.

In general, where features are described herein with reference to an embodiment of one aspect of the invention, corresponding features may be provided in embodiments of another aspect of the invention as appropriate.

BRIEF DESCRIPTION OF THE DRAWINGS

Preferred embodiments of the invention will now be described, by way of illustrative and non-limiting example, with reference to the accompanying drawings in which.

DESCRIPTION OF PREFERRED EMBODIMENTS

Figure 1:
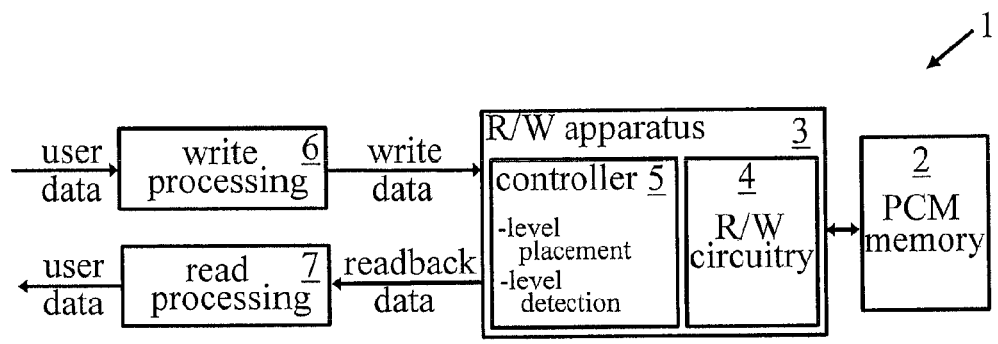
FIG. 1 is a schematic block diagram of memory apparatus embodying the invention.

FIG. 1 is a simplified schematic of a memory apparatus embodying the invention. The memory apparatus 1 includes phase-change memory (PCM) 2 for storing data in one or more integrated arrays of multilevel PCM cells. Though shown as a single block in the figure, in general memory 2 may comprise any desired configuration of PCM storage units ranging, for example, from a single chip or die to a plurality of storage banks each containing multiple packages of storage chips. Reading and writing of data to memory 2 is performed by read/write (R/W) apparatus 3. Apparatus 3 includes data-write and read-measurement circuitry (R/W circuitry) 4 for programming PCM cells in data write operations and for making cell-state measurements during programming and data readback operations. The R/W circuitry addresses individual PCM cells for write and read purposes in a known manner by applying appropriate voltages to an array of word and bit lines in memory ensemble 2. A read/write controller 5 controls operation of apparatus 3 generally and includes functionality for determining cell-state, i.e. level detection, during data readback based on read measurements by circuitry 4. Controller 5 further includes functionality for implementing a level placement technique described in detail below. As indicated by block 6 in the figure, user data input to apparatus 1 is typically subjected to some form of write-processing, such as coding for error-correction purposes, before being supplied as write data to read/write apparatus 3. Similarly, readback data output by apparatus 3 is generally processed by a read-processing module 7, e.g. for codeword detection and error correction, to recover the original input user data.

As will be appreciated by those skilled in the art, functionality of read/write apparatus 3 may be implemented in practice by control circuitry of a memory device, e.g. a memory chip, which forms part of memory 2, or by a separate device, such as a memory controller, which controls a set of memory devices in memory 2. In a typical arrangement, the functionality may be implemented via a combination of control logic in a memory controller and individual memory devices. The functionality of controller 5 of the read/write apparatus can be implemented in general in hardware or software or a combination thereof. For reasons of operating speed, the use of hardwired logic circuits is generally preferred to implement functionality as far as possible. Suitable implementations will be readily apparent to those skilled in the art from the description herein.

Data read and write operations are generally performed in a known manner in apparatus 1. A data write operation involves programming each cell to one of the q>2 programming levels defined for data storage. In general, programming can be performed via a single-step process or an iterative process. A single-step programming operation involves application of a predetermined programming signal to set a cell to a desired level. As described earlier, iterative programming involves a series of programming and read steps to achieve a desired programming level. Either way, each of the q programming levels corresponds to a predefined value of the characteristic cell-state metric which is measured during read operations. The predefined metric value for each level constitutes the target metric value when programming a cell to that level. Data readback involves reading cells to obtain a read metric value for each cell, followed by level-detection to determine from the read metric values which of the q cell-levels each cell is set to. Level-detection can be performed using various known techniques and typically involves comparing read metric values with a set of threshold values defining the different cell-levels.

The particular set of q programming levels to be used for data storage is determined prior to operation via a level placement technique. Depending on the particular structure and arrangement of memory 2 and read/write apparatus 3, the level placement operation may be performed for memory 2 as a whole or separately for different parts of the overall memory arrangement. In this example, it is assumed that controller 5 performs the level placement operation separately for each individual memory array within overall memory 2. This operation is performed by level placement apparatus 10 provided in controller 5 of read/write apparatus 3.

Figure 2:
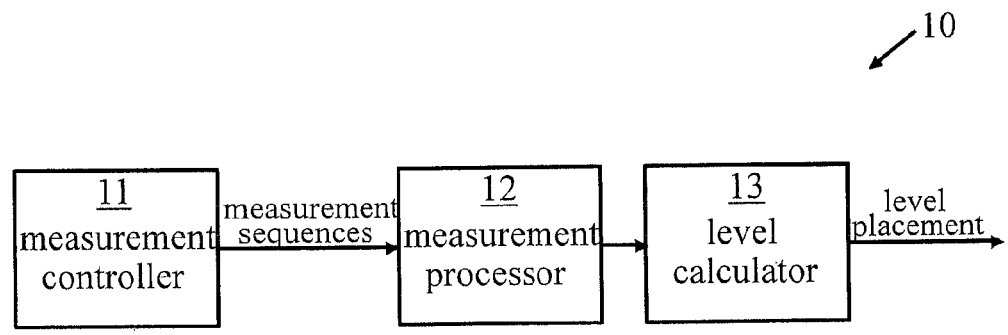
FIG. 2 is a schematic block diagram of level placement apparatus in the memory apparatus of FIG. 1.

FIG. 2 indicates the main functional blocks of the level placement apparatus 10. The apparatus comprises a measurement controller 11, a measurement processor 12 and a level calculator 13. Each of the functional blocks 11, 12 and 13 comprises control logic for implementing particular steps of the level placement process to be described. This control logic can be embodied in hardware or software or a combination of hardware and software components. For example, one or more of the operational steps could be performed in whole or in part by software which configures a processor to implement the functionality described, and suitable software will be readily apparent to those skilled in the art.

Briefly, in operation of apparatus 10, measurement controller 11 controls read/write circuitry 4 to perform programming and read operations detailed below to obtain a set of measurement sequences characterizing the memory array in question. The measurement sequences are supplied to measurement processor 12 which processes the sequences as detailed below to derive information enabling estimation of statistics for an arbitrary cell-level as a function of time. Level calculator 13 then uses this information for level placement, calculating a set of q programming levels which has a desired property over time. In this embodiment, an optimum level placement for the array is calculated as the set of q programming levels which corresponds to a minimum read-error probability at a target retention time for the array.

Operation of the level placement apparatus will be described in more detail with reference to the flow diagram of FIG. 3. On initiation of a level placement operation, as indicated by step 20, measurement controller 11 receives as input the characteristic operating parameters of the array in question, in particular the number of cells in the array, the desired number of storage levels q, and the operative signal range (i.e. the minimum and maximum possible read signal levels for cells). Based on these parameters, in step 21 the measurement controller 11 selects a portion of the array consisting of a number of cells $N_C$ to be used for the array characterization, and an initial set of L programming levels to be used in this process. The L programming levels are respectively defined by L target metric values for the programming operation. Next, in step 22 the measurement controller controls R/W circuitry 4 to program different groups of the $N_C$ cells to respective levels of the initial set of L programming levels. In step 23, measurement controller 11 then controls R/W circuitry 4 to read each of the $N_C$ programmed cells at a series of time instants. In this way, a sequence of read metric values, corresponding to successive time instants after programming, is obtained for each of the $N_C$ cells. These measurement sequences are supplied by measurement controller 11 to measurement processor 12 which performs the next three steps of the FIG. 3 process.

Figure 3:
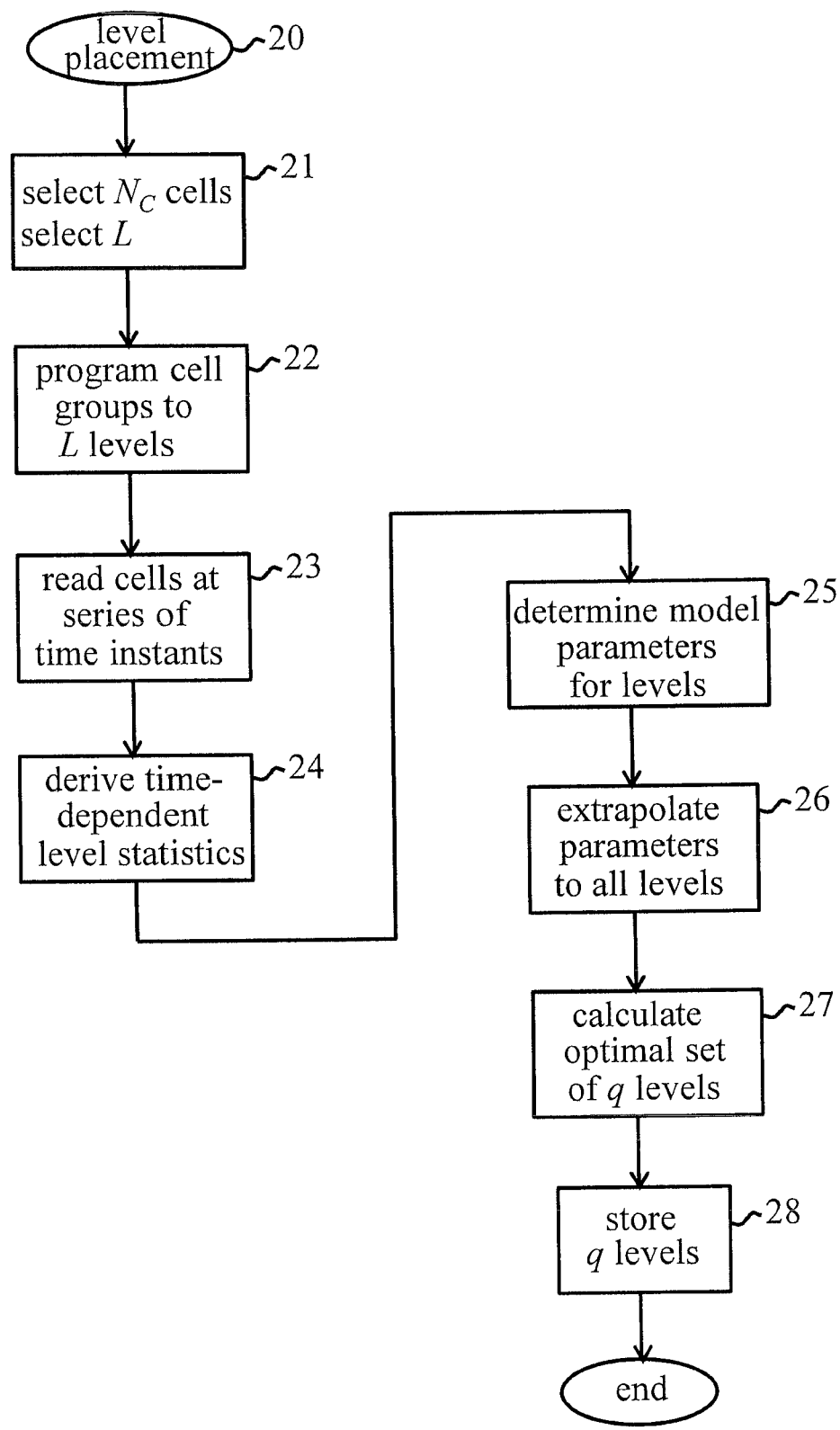
FIG. 3 shows key steps in operation of the level placement apparatus.

In step 24 of FIG. 3, measurement processor 12 processes the measurement sequences for the group of cells programmed to each of the L programming levels to derive statistical data as a function of time for that level. This is explained further below. The resulting time-dependent statistical data for each level is then processed in step 25 to determine for that level at least one parameter of a model defining variation with time of the statistical data for programming levels. Again, this process will be explained in detail below. Next, in step 26, measurement processor 12 extrapolates the parameters for the levels as illustrated below to define parameter variation as a function of level.

In step 27 of FIG. 3, the level calculator 13 uses the parameter variation with level, as derived in step 26, together with the aforementioned model to calculate the optimal placement within the available signal range of the q target metric values for programming the q cell-levels. This calculation is performed via an iterative optimization process described further below. In step 28, the resulting set of q programming levels is stored by controller 5 for use in subsequent programming of the memory array, and the level placement operation is complete.

Preferred implementation details for the basic level placement operation of FIG. 3 are described in the following.

Considering first the array characterization process, the number $N_C$ in step 21 of FIG. 3 should ideally be sufficiently large to permit meaningful statistics to be derived for the array in question. By way of example, a typical number might be 64 k-cells, i.e. (64×1024) individual memory cells. In general, of course, $N_C$ can be selected as desired depending on required accuracy in a given scenario. The initial set of L programming levels selected by measurement controller 11 preferably comprises L>q levels, for instance L=2q in a typical implementation. As indicated above, the L levels are defined by L target metric values for programming, where the metric may be any convenient metric for cell-state. A typical metric is defined in terms of cell current or resistance, and may be defined in the linear or logarithmic domain. In the preferred embodiment to be described, the metric is defined as the logarithm of cell current, log(I). The L levels are ideally distributed across the whole of the available signal range, and may be uniformly or non-uniformly spaced. In the preferred embodiment below, the L levels are selected to be uniformly spaced in logarithm of current between minimum and maximum values which correspond respectively to the RESET state (i.e. the fully-amorphous, highest-resistance state) and the SET state (i.e. the fully-crystalline, lowest-resistance state) of the PCM cells.

Figure 4:
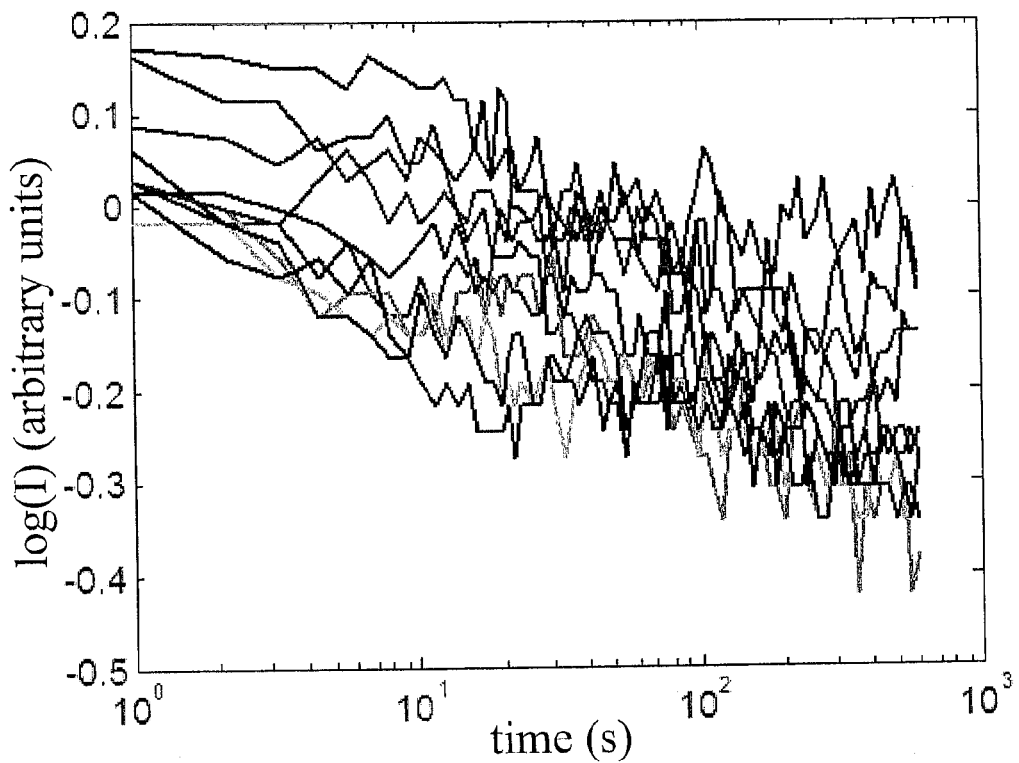
FIG. 4 illustrates exemplary measurement sequences obtained during a level placement operation.

After programming groups of the $N_C$ cells to the L levels, the measurement sequences are preferably obtained in step 23 by reading cells at a series of time instants spanning a plurality of orders of magnitude of time. Measurements are most preferably made over several orders of magnitude of time, e.g. from microseconds to a few hundreds of seconds after programming. The number of measurements can be selected based on required accuracy, but may typically comprise of the order of 100 measurements on each cell. The resulting measurement sequences then indicate variation of the read metric with time for all cells. These measurement sequences are subject to the various noise and temporal drift effects discussed earlier. This is illustrated in the simple example of FIG. 4 which shows an exemplary set of measurement sequences for ten PCM cells each programmed to the same nominal level.

Considering now step 24 of FIG. 3, measurement controller 12 processes the measurement sequences for the group of cells programmed to each of the L levels to derive time-dependent statistical data for that level. This statistical data may in general comprise one or more statistical quantities, and conveniently comprises at least a first quantity indicative of an average read metric value for the level. The average here might be, for example, the mean, median or mode. The statistical data preferably also comprises a second quantity indicative of variance in read metric values. The derived quantities could represent the average and variance per se or could be some function of these values. In the present embodiment, the quantities derived by measurement controller 12 are the mean and variance of the read metric values, these quantities being derived as a function of time based on the measurement sequences. That is, the mean and variance of the read metric values $\log(I_k(t))$ at corresponding time instants are calculated at each time instant for cells (k) in the group corresponding to each of the L levels. The resulting sequences of mean and variance values for the series of time instants thus provide an estimate of the variation of these quantities with time for the corresponding level.

In step 25 of FIG. 3, measurement controller 12 processes the time-dependent statistical data from step 24 in association with a model defining variation with time of the statistical data for programming levels. The model employed here may be a predetermined model, e.g. empirically determined for the memory cells in general, or may be wholly or partially constructed based on analysis of the time-dependent statistical data derived in step 24. In this example, drift and noise for each cell k is assumed to follow the power-law model for drift as expressed by:

$$\log(I_k(t))=\log(I_k(t_0))-v_k \log(t/t_0)+n_k(t) \quad (1)$$

where $I_k(t)$ is the read-current at time t, $v_k$ is the drift exponent, $n_k(t)$ is noise process for cell k, and $t_0$ is the time instant at which the first measurement is taken. It can be shown that, for a given programming level:

$$E[\log(I(t))]=E[\log(I(t_0))]-E[v]\log(t/t_0) \quad (2)$$

and $$V[\log(I(t))]=V[\log(I(t_0))]+V[v](\log(t/t_0))^2+V[n(t)]-2C[\log(I(t_0)),v]\log(t/t_0)+2C[\log(I(t_0)),n(t)]-2C[v,n(t)]\log(t/t_0) \quad (3)$$

where: E[a] is the mean of a; V[a] is the variance of a; and C[a, b] is the covariance of a, b.

Comparison of this basic model with time-dependent statistical data derived for cell-levels as in step 24 above shows that, for all levels i, i=1, 2, . . . L, the mean of the level distributions expressed by the measurement series for each level is well-fitted with a linear function of $\log(t/t_0)$:

$$\mu^i(t)=\mu^i(t_0)-E[v]^i \log(t/t_0) \quad (4)$$

where, for each level i, $\mu^i(t)=E[\log(I(t))]$. Equation (4) thus corresponds directly to Equation (2) as predicted by the power-law model above. Similarly, comparison of the basic model with time-dependent statistical data derived as above demonstrates that the standard deviation of the time-dependent level distributions is also well approximated with a linear function of $\log(t/t_0)$:

$$\sigma^i(t)=\alpha^i+\beta^i \log(t/t_0) \quad (5)$$

where, for each level i, $\sigma^i(t)=\sqrt{(V[\log(I(t)])}$. Equation (5) thus corresponds to a simplified version of Equation (3) predicted by the power-law model above.

Figure 5:
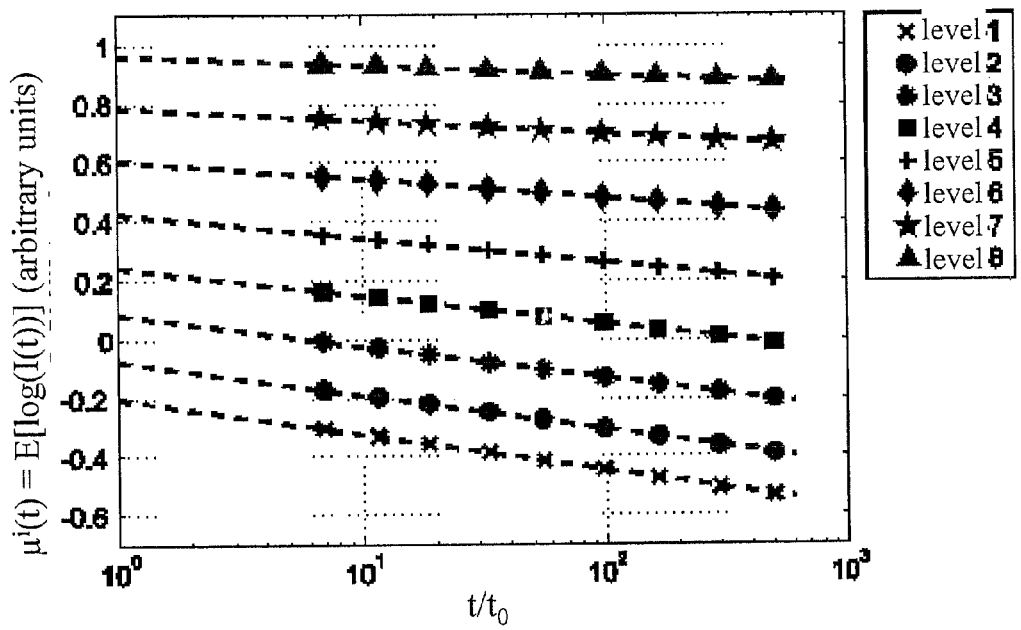
FIGS. 5 and 6 illustrate fitting of statistical data for cell-levels with a model during a level placement operation.
Figure 6:
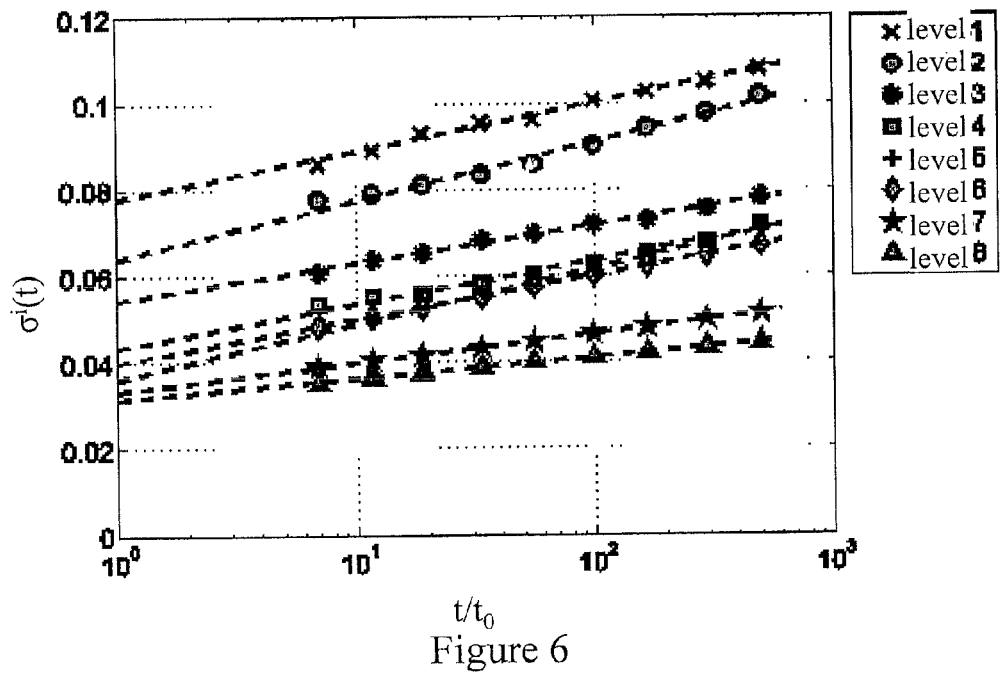

Equations (4) and (5) above constitute a simple empirical model describing variation with time of the first and second order statistics of programming level distributions corresponding to the statistical data derived in step 24. In step 25 of FIG. 3, the statistical data derived for the L levels is processed to determine values for the parameters $\mu^i(t_0)$, $E[v]^i$, $\alpha^i$ and $\beta^i$ of the foregoing model for each level i. In particular, the time-dependent mean derived for each level is fitted with Equation (4), and the standard deviation (determined as the square root of the time-dependent variance values for each level), is fitted with Equation (5) above. FIG. 5 shows illustrative results for fitting of the mean values for L=8 programming levels in one example. FIG. 6 shows corresponding results for fitting of the standard deviation values for these levels. The model parameters $\mu^i(t_0)$, $E[v]^i$, $\alpha^i$ and $\beta^i$ for each level i can thus be readily determined from simple linear fits performed by measurement processor 12.

Figure 7:
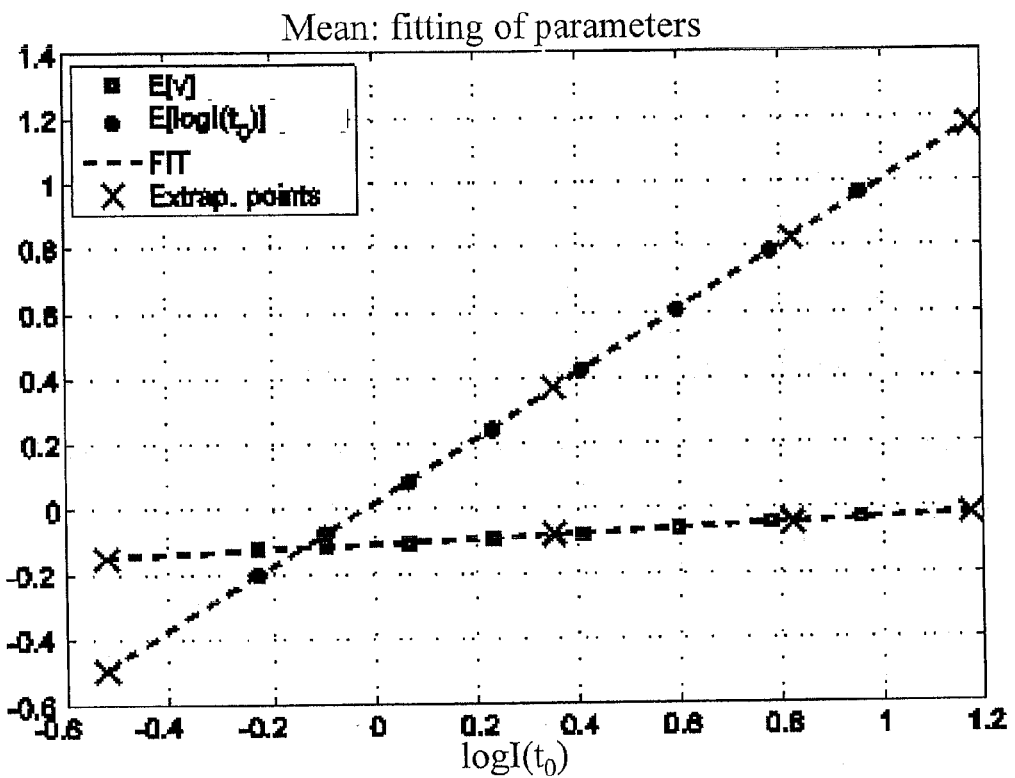
FIGS. 7 and 8 illustrate extrapolation of model parameters during a level placement operation.
Figure 8:
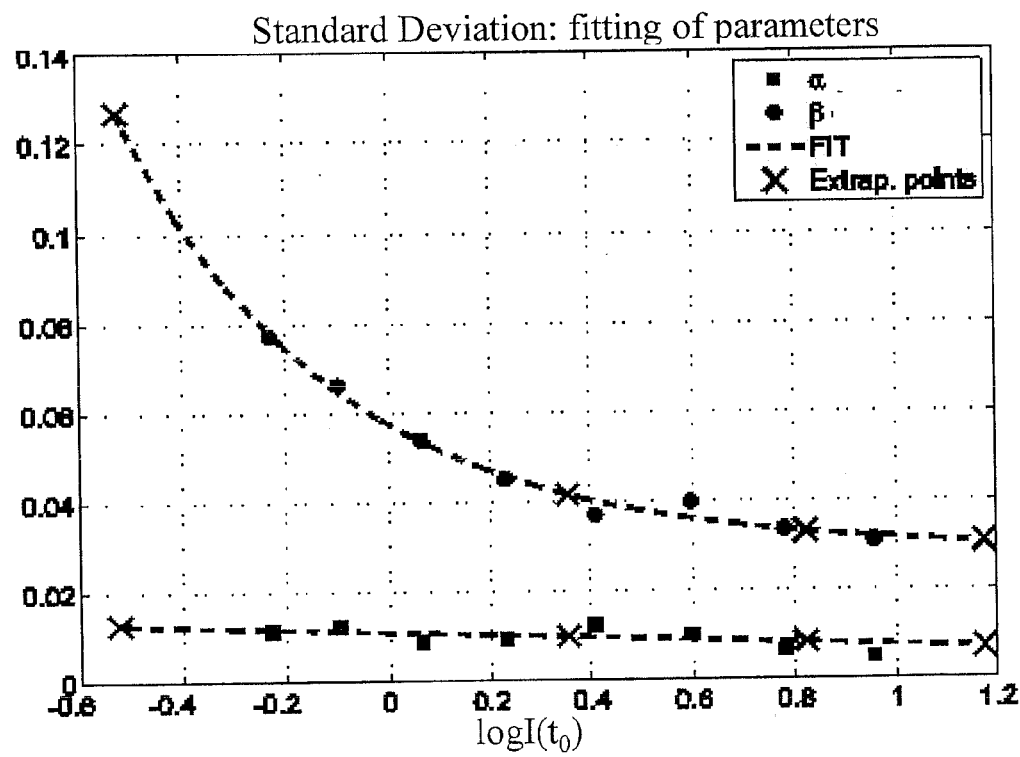

Step 26 of FIG. 3 involves extrapolation of the level parameters obtained by the above process to define variation of each parameter as a function of level. In particular, by fitting the level parameters as a function of programming level, each parameter can effectively be extrapolated to obtain a continuous variable. This process is illustrated in FIG. 7 for the "mean parameters" $\mu^i(t_0)$, $E[v]^i$ in the example above, where the plotted points represent the experimental parameter values as extracted in step 25 and the crosses represent extrapolated points. Programming level is quantified on the abscissa as the corresponding metric value at $t=t_0$, i.e. $\log I(t_0)$. FIG. 8 illustrates the corresponding extrapolation process for the "standard deviation parameters" $\alpha^i$ and $\beta^i$ in this example.

The extrapolation of model parameters in step 26 effectively allows statistics of any arbitrary level to be estimated at any point in time. In particular, the model parameters for an arbitrary level can be determined from the parameter extrapolation process, and these parameter values can then be applied in the model defined by Equations (4) and (5) above. This then provides an estimate of the time evolution of the statistics for the level in question. This information is exploited by the level calculator 13 in step 27 of FIG. 3 to determine an optimal level placement. Clearly, since both means and variances of level distributions are time-varying, it is not possible in general to determine a level placement for programming that is optimal at all times. However, optimality is defined in level calculator 13 here as the best possible error-probability at a given time point. The selected time point in this example is the target retention time $t_R$ for the memory array, though other time points may be employed here as discussed below. Since evolution of the level statistics is monotonic in time, the error probability will also increase monotonically in time. Reliable error performance can thus be guaranteed at least up to the specified retention time in this embodiment.

The optimal level placement is determined in level calculator 13 as follows. The process starts by selecting q uniformly-spaced levels within the available signal range (though other, non-uniformly spaced level allocations might equally be employed). Based on the parameter variation with level determined by the extrapolation process above, the model parameters are determined for these initial q levels. These parameters are then applied to the model defined by Equations (4) and (5) to calculate the level statistics (means and standard deviations) at time $t=t_R$. The level calculator then runs an iterative optimization algorithm to calculate the level placement at the retention time $t_R$ which minimizes the read-error probability $P_{error}$. The read error probability $P_{error}$ can be calculated in known manner here based on the level statistics $\mu^i(t_R)$, $\sigma^i(t_R)$ and predefined reference values (e.g. threshold values or ranges) used for detection of the cell-levels on readback. (It can be assumed here that the level probability density functions (PDFs) are normal so that the mean and standard deviation completely specify each level PDF). Various known iterative algorithms may be employed in this optimization process as will be readily apparent to those skilled in the art. From the final estimates of the level-means $\mu^i(t_R)$ obtained via the optimization process, the optimal level placement is given by $\mu^i(t_0)$ as determined from equation (4) for i=1 to q.

Figure 9:
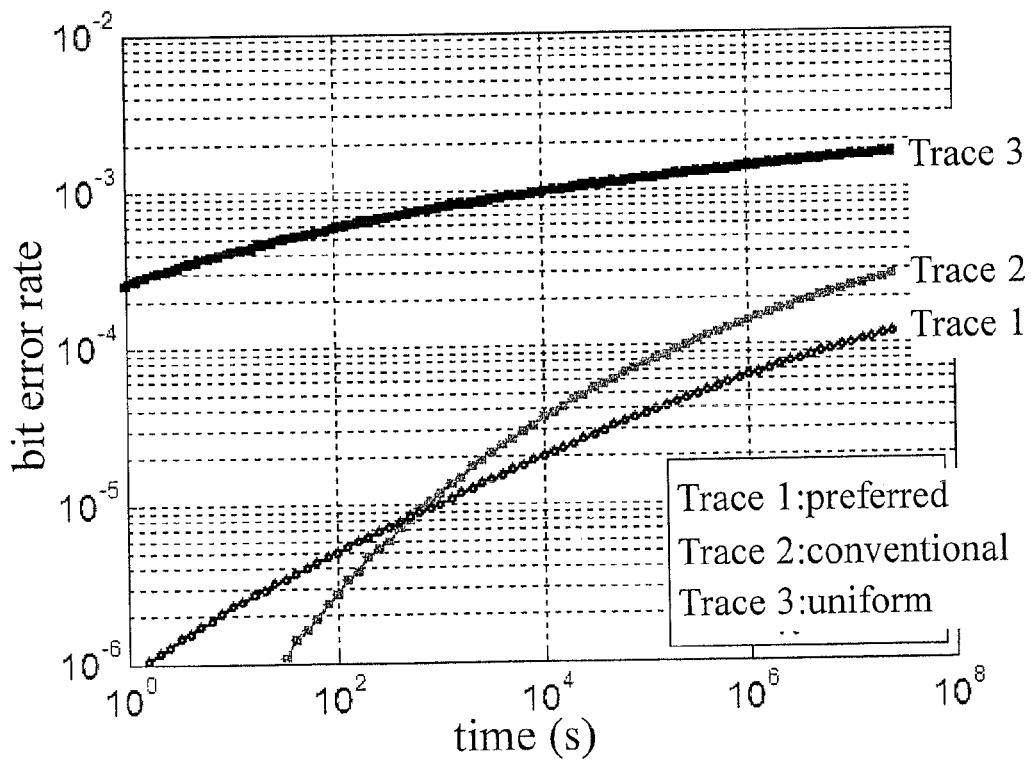
FIG. 9 compares performance of a level placement method embodying the invention with prior methods.

It will be seen that the above process provides a technique for estimating the statistics of any possible cell level at any time point, thereby permitting optimization of the level placement for a specified target retention time. Unlike prior systems, the level placement technique accounts for both level- and time-dependence of the level statistics. Use of this technique for MLC programming offers significant advantages in terms of long MLC-state retention, i.e., acceptable worst-case error-rate over long time periods. Level placement methods embodying the invention can readily outperform other methods that are agnostic to either time- or level-dependence of cell-ensemble statistics, offering superior worst-case performance over longer time-scales, i.e. longer retention. By way of example, FIG. 9 compares error performance for an exemplary array employing the preferred level placement technique detailed above (Trace 1) and the conventional level placement technique described earlier based on optimization of statistics at programming time, i.e. $t=t_0$, (Trace 2). The error-performance based on a uniform level spacing (Trace 3) is also shown for comparison purposes. The level placement for the embodiment of Trace 1 was calculated based on a target retention time of $t_R=10^4$ s for illustration purposes. It can be seen that the proposed technique significantly outperforms the conventional one, guaranteeing acceptable error performance at all times at least up to the target retention time.

While preferred embodiments are described above, many alternatives and modifications can of course be envisaged. Some examples are given below.

Time points other than the target retention time $t_R$ may be used for the optimization process, e.g. the target time between refreshes of a memory array. While the set of levels is optimized based on minimal error probability at a given time above, level placements can be calculated to provide other desired properties over time. The required property of the level placement could depend in various ways on time variation of the individual levels and their interrelationship, e.g. considering error probabilities (or other statistical characteristics) associated with individual levels, whether at a particular time or over a particular period after programming. In general, any desired time-dependent property might be specified for determining the final level placement.

When optimizing the level placement based on error probability at a specified time, an error probability less than some defined threshold could be deemed optimum rather than the minimum possible value predicted by the optimization process.

The level placement process can be readily applied with other read metrics and other models for the time-dependence of statistics. For example, the extracted statistical quantities (means and variances above) could be fitted with other functions, e.g. non-affine functions of log(t). Depending on the particular statistical data and model employed in a given process, in general one or more model parameters may be derived for defining the time variation of level statistics in step 25 of FIG. 3.

As indicated earlier, level placement methods embodying the invention may be implemented by a memory controller for one or more memory devices controlled thereby. In this case the level placement may be performed as a "one-off" procedure for each memory chip and the resulting levels stored in on-chip registers for use during subsequent programming of that chip. In other scenarios the level placement could be performed by on-chip control logic, and may be either executed either as a "one-off" procedure or periodically to re-calibrate parameters to account for changes with cell usage.

While memory 2 employs PCM cells in the above embodiment, the techniques described can of course be applied to other multilevel solid state memory cells, such as flash memory cells, where similar considerations apply.

It will be appreciated that many changes and modifications can be made to the exemplary embodiments described within the spirit and scope of the present invention.

What is claimed is:

1. A level placement method for q-level cells of solid-state memory, where q>2, the method comprising:
controlling reading of a group of cells, programmed to respective levels of a predetermined plurality of programming levels, at a series of time instants to obtain a sequence of read metric values for each of the group of cells;
processing the sequence of read metric values for the group of cells to derive statistical data as a function of time for each level;
processing said statistical data to determine at least one parameter of a model defining variation with time of the statistical data; and
calculating, using a processor, from a variation of said parameter as a function of level and said model, a set of q programming levels which has a pre-determined property over time.

2. A method according to claim 1, wherein the set of q programming levels have pre-determined statistical data defined by said model at a predetermined times after programming.

3. A method according to claim 2, wherein said desired statistical data corresponds to a pre-determined read-error probability.

4. A method according to claim 3, wherein said pre-determined read-error probability corresponds to a minimum read-error probability for sets of q levels at said predetermined time.

5. A method according to claim 3, wherein calculating said set of q programming levels includes performing an iterative optimization process.

6. A method according to claim 1, wherein said statistical data comprises a first quantity indicative of an average read metric value.

7. A method according to claim 1, wherein said statistical data comprises a second quantity indicative of variance in read metric values.

8. A method according to claim 1, wherein processing said statistical data includes fitting the statistical data with said model.

9. A method according to claim 1, further comprising determining a plurality of parameters of said model for each level.

10. A method according to claim 1, wherein said predetermined plurality of programming levels L comprises L>q levels.

11. A non-transitory computer readable medium containing executable program instructions for causing a computer to implement a method according to claim 1.

12. An apparatus for determining level placement in q-level cells of solid-state memory, where q>2, the apparatus comprising:
   a measurement controller configured to control reading of a group cells, programmed to respective levels of a pre-determined plurality of programming levels, at a series of time instants to obtain a sequence of read metric values for that cell;
   a measurement processor configured to process the sequence of read metric values for the group of cells to derive statistical data as a function of time for the level of each of the cells and to process said statistical data to determine at least one parameter of a model defining variation with time of the statistical data; and
   a level calculator configured to calculate, using a processor, from said a variation of said parameter as a function of level and said model, a set of q programming levels which has a pre-determined property over time.

13. Apparatus according to claim 12, wherein the level calculator is adapted such that the set of q programming levels have pre-determined statistical data defined by said model at a predetermined time after programming.

14. Apparatus according to claim 13, wherein the level calculator is adapted such that said pre-determined statistical data corresponds to a desired read-error probability.

15. Apparatus according to claim 14, wherein the level calculator is adapted such that said pre-determined read-error probability corresponds to a minimum read-error probability for the set of q programming levels at said predetermined time.

16. A memory apparatus, comprising:
   solid-state memory having a plurality of q-level cells, where q>2, read/write circuitry for writing data in the solid-state memory by programming cells to respective levels and for reading cells to obtain respective read metric values each corresponding to a level of the plurality of q-level cells, and a level placement apparatus for determining level placement for the plurality of q-level cells, wherein the level placement apparatus comprises:
   a measurement controller configured to control reading of a group cells, programmed to respective levels of a pre-determined plurality of programming levels, at a series of time instants to obtain a sequence of read metric values for that cell;
   a measurement processor configured to process the sequence of read metric values for the group of cells to derive statistical data as a function of time for the level of each of the group of cells and to process said statistical data to determine at least one parameter of a model defining variation with time of the statistical data; and
   a level calculator configured to calculate, using a processor, from said a variation of said parameter as a function of level and said model, a set of q programming levels which has a pre-determined property over time.

17. The memory apparatus according to claim 16, wherein the plurality of q-level cells include phase-change memory cells.

* * * * *